United States Patent [19]

Fichter

[11] 4,389,653
[45] Jun. 21, 1983

[54] LINE RECORDING DEVICE

[75] Inventor: Manfred Fichter, Königsfeld, Fed. Rep. of Germany

[73] Assignee: Kienzle Apparate GmbH, Villingen-Schwenningen, Fed. Rep. of Germany

[21] Appl. No.: 263,564

[22] Filed: May 14, 1981

[30] Foreign Application Priority Data

May 16, 1980 [DE] Fed. Rep. of Germany ....... 3018744

[51] Int. Cl.³ ........................ G01D 9/00; G01D 15/08
[52] U.S. Cl. ......................................... 346/49; 346/23
[58] Field of Search ...................... 346/49, 50, 23, 66, 346/68

[56] References Cited

U.S. PATENT DOCUMENTS 3,039,101 6/1962 Perdue ............................ 346/23 X
3,454,953 7/1969 Lloyd et al. ......................... 346/23
3,465,359 9/1969 Hackley et al. ...................... 346/23

FOREIGN PATENT DOCUMENTS 1056759 1/1967 United Kingdom .
1564665 4/1980 United Kingdom .

Primary Examiner—Donald A. Griffin
Attorney, Agent, or Firm—Toren, McGeady and Stanger

[57] ABSTRACT

In the disclosed recording device, variable values are measured and recorded on a recorder carrier by moving the record carrier along a given direction. A number of recorders form a row and define separate tracks along the direction when the record carrier moves and trace lines along the tracks when actuated. The recorders are divided into a first group and a second group while suitable means measure the variable values. An energizing arrangement energizes a different recorder of the first group for each one of a number of ranges of measured values and energizes a different recorder of the second group for each one of a number of increments of measured values within each range. Each recorder of each second group is energized for the same corresponding increment regardless of the particular range.

6 Claims, 4 Drawing Figures

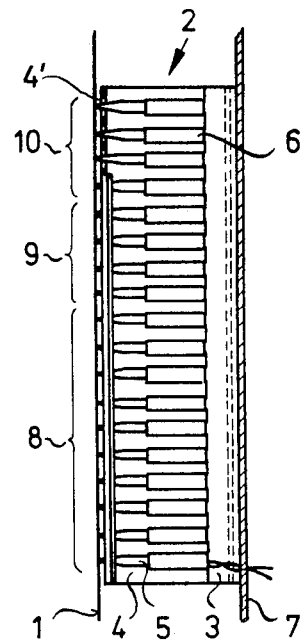
FIG.1
FIG. 4
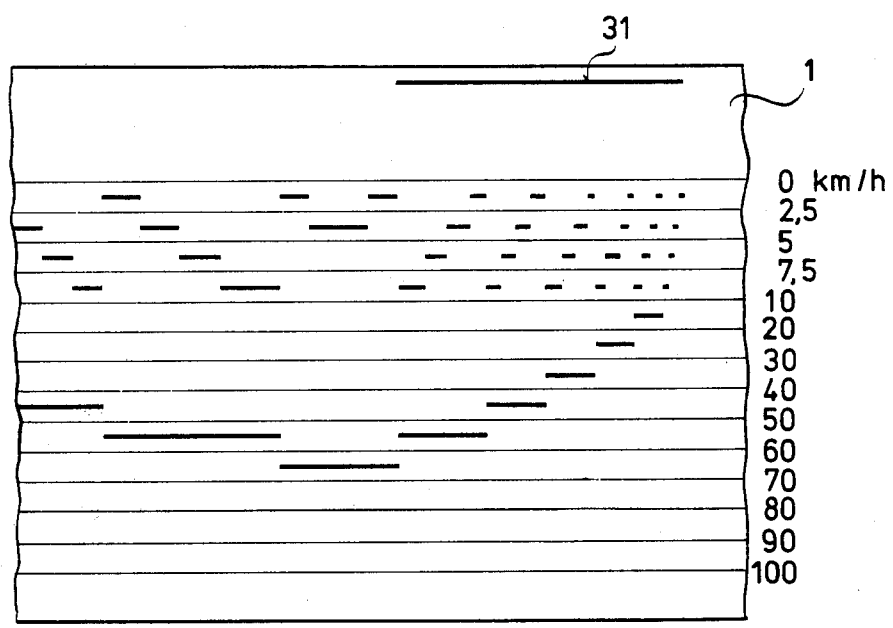

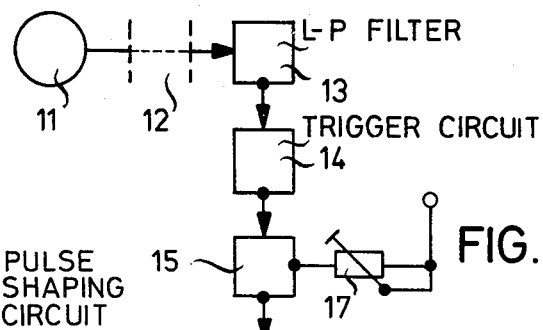
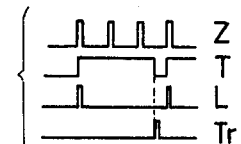
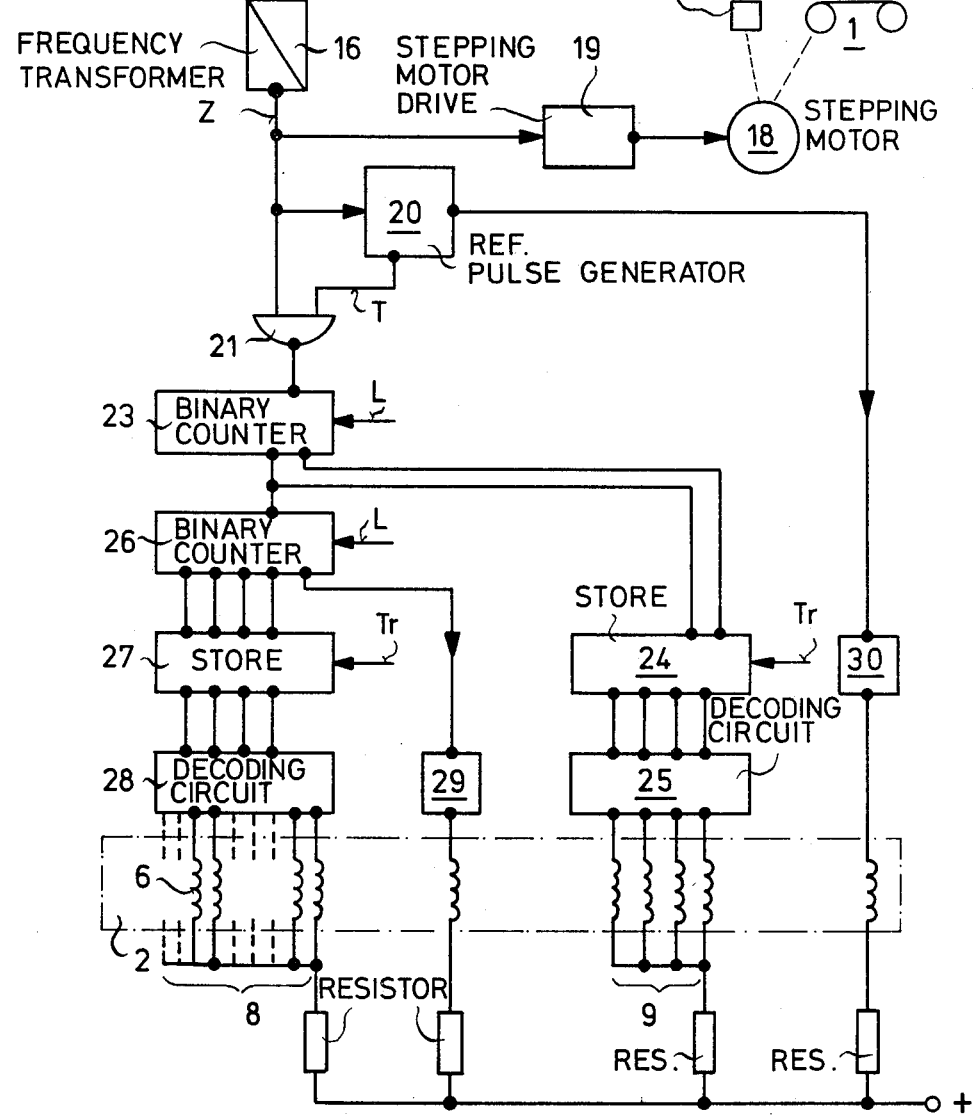

LINE RECORDING DEVICE

BACKGROUND OF THE INVENTION

This invention relates to recording devices, particularly the type in which several fixed recording members are arranged along a row transverse to the transport direction of a record carrier for continuously recording variations in values as line diagrams along several tracks.

In contrast to recording arrangements in which a single writing instrument is moved in proportion to the quantity measured, each recording element of such recording arrangements traces a line or bar along a recording track reserved for a predetermined value range as long as the value detected is within this predetermined range. Such step-like recorders should provide conspicuous and easily readable indications which are also inexpensively machine readable. For this purpose, the values being sensed and recorded must be quantizable, and the effects of the discontinuities in the indications should be overcome.

The above requirements are usually obtainable in so-called self-deleting recording devices where the rate of change of the quantity measured is small compared to the speed of the record carrier. These kinds of recording devices stress only variations of measurements just prior to a particular event while earlier indications are ignored. This emphasis permits the recordings to be stretched out to achieve high resolution over a period of time. A typical example is a vehicle-mounted device called an accident recorder which particularly maintains a record of the speed of a vehicle over the distance most recently travelled. The aforementioned step bar graphing is particularly suitable for such a recorder because it allows one interpreting the record to attribute indication to specific speed ranges.

The desired recording apparatus with its fixed arrangement of several recording members in a row has a decided advantage from the technical point of view. It avoids rigid recording means which are moved relative to the record carrier, generally in dependence on the sensed values. This makes the recording device less sensitive to shocks, reduces its service expenses and also simplifies production and mounting. On the other hand, the usually restricted recording space available on such a record carrier cannot be optimized. This is so because the recording members, which are assembled as a recording comb, cannot be arranged as close to each other as desired due to space and production limitations.

Under the circumstances, display resolution of the quantity measured is limited, and in many cases unsatisfactory. Often, it is at least important to know whether the actual value measured is nearer the lower or upper limit of the range indicated. Therefore, proposals have been made to use a recording comb which is itself movable transverse to the recording direction of the record carrier. However, this has known disadvantages, such as the need for expensive mechanical parts and a movable current input, and has the effect of generating noise.

SUMMARY OF THE INVENTION

An object of the invention is to improve recorders.
Another object of the invention is to avoid the disadvantages of known recording devices with fixed recording members arranged in rows.

Still another object is to use the recording range of the record carrier optimally and essentially to increase the resolution of the representation of sensed values while avoiding problems of space and production with respect to the arrangement of the recording members.

According to a feature of the invention, each recording member of a first group records inputs representing a given range of sensed values, and the recording members of another group trace line diagrams for smaller incremental ranges.

According to another feature of the invention, the recording members form parts of a recording comb and a first pulse counter is connected with a first group of recording members via a first intermediate store and a first decoding circuit while a second counter is connected to a second group of recording members via a second intermediate store and decoding circuit for controlling the recording members in dependence on the values detected.

These and other features of the invention are pointed out in the claims. Other objects and advantages of the invention will be evident from the following description when read in light of the accompanying drawings.

BRIEF DESCRIPTION OF THE DRAWINGS

In the drawings:

FIG. 1 is an elevation showing a recording comb embodying features of the invention.

FIG. 2 is a circuit diagram of a system for controlling the individual members of the recording comb in FIG. 1 and embodying features of the invention.

FIG. 3 is a pulse diagram of signals in the circuit of FIG. 2.

FIG. 4 is a portion of a record carrier on which a speed diagram has been recorded.

DESCRIPTION OF PREFERRED EMBODIMENTS

In FIG. 1, a record carrier 1 displays visually recognizable recordings produced by magnetic recording or writing members and is driven either in dependence upon time or the measured quantity. A recording comb 2 is composed of a first low-remanence ferromagnetic sheet metal part 3 forming a toothed comb and a second sheet metal part 4 made of the same material and operating as a magnetic return. The part 4 forms cutouts 4'. Teeth 5 of the first sheet metal part 3 project through the cutouts 4' in the sheet metal part 4 without touching the latter. The two sheet metal parts 3 and 4, together with the energizing coils 6 which are mounted on the teeth 5 that form the individual recording members, are, according to an embodiment of the invention, fastened on a circuit board 7 to be inserted into the recording device.

According to the invention, the recording comb 2 is controlled by having a first group 8 of recording members 5 serve to trace stroke or line diagrams that signify ranges of sensed values of higher denominations, for example, decade denominations. A second group 9 of recording members 5 which should include a least two recording members 5 are energized so that they also trace lines for incremental ranges within each sensed value range, simultaneously with the recording of the decade line diagrams. To evaluate the recordings therefor, the lower value of the simultaneously recorded diagram showing the incremental ranges has to be added to the higher value decade lines.

Still another group 10 of recording members 5, 6 indicate the time and operation of the brakes or direction indicators in the vehicle. According to an embodiment of the invention, the group 10 is eliminated and only groups 8 and 9 are used.

The formation of the sensed or measured quantity for recording the vehicle speed is shown in the block diagram of FIG. 2. Here, a pulse generator 11 suitably arranged on the vehicle is driven in proportion to the distances covered, and therefore, produces a specific number of pulses per distance in a transmission line 12. The pulse shape and the pulse intervals may vary within wide limits. A low pass filter 13 filters the pulses and applies them to a trigger circuit 14 which transmits trigger signals to a pulse shaping circuit 15 whose output is received by a frequency transformer 16. The frequency transformer 16 is set to produce an output each time it receives a predetermined number of pulses corresponding to number of pulses per meter and representing the apparatus constant. The pulse shaping circuit includes a potentiometer 17 for modifying the pulse length to adapt various pulse generators to vehicle data. The pulses produced by the frequency transformer 16, which may be said to constitute distance pulses, are now introduced into a stepping motor drive 19 that controls a stepping motor 18. The latter in connection with suitable gearing, if necessary, drives the record carrier 1 as well as a distance counter D. A reference or clock pulse generator 20 as well as an AND gate 21 also receive the output of the transformer 16. The clock pulse generator 20 serves to deliver the constant equalizing or measuring intervals which are necessary for speed measurements. The generator 20 is activated by the leading edge of the first incoming distance pulse Z and opens the gate 21 for a measuring time T so that the following distance pulses Z may be summed in a binary counter 23. The latter is connected to an intermediate store or memory 24 as well as to a decoding circuit 25. It is also coupled to a second binary counter 26 for summing the decade values of a measured quantity. The counter 26 is connected to a second intermediate store 27 which in turn is coupled to a coding circuit 28.

Upon starting of the clock pulse generator 20, as shown in the pulse diagram of FIG. 3, a cancel or reset pulse L resets the counters 23 and 26. At the end of each measuring time T, a transfer pulse Tr transfers the counted values from the counters 23 and 26 to the stores 24 and 27. The outputs of the stores 24 and 27 are connected to the decoding circuits 25 and 28. The decoding circuit 28 energizes the magnetic coils 6 surrounding the teeth 5 of group 8 in the recording comb. On the other hand, the outputs of decoding circuit 25 energize the magnetic coils 6 about the teeth 5 of group 9 on the comb 2.

The first recording member 5, 6 of group 8 will operate when the measured quantity is within its range, of between 10 and 20 km/h or mph. Simultaneously, one of the recording members of group 9 may operate. In the present embodiment, for each decade speed range, there exist four incremental ranges, I representing speed values between 0 and 2.5, 2.5 to 5, 5 to 7.5, and 7.5 to 10 km/h or mph. These are traced along a separate line diagram.

According to a special embodiment of the invention, the last recording member of group 8 is connected directly to the pulse counter 26 through a timer circuit 29 which is set when a carry pulse is produced. The time constant of the timing circuit 29 is chosen to be shorter than the measuring time T so as to cause its recording member to produce a dotted recording line and thereby especially identify this speed limit. On the other hand, separately energizing this recording member permits extension of the measuring range.

Still another timing circuit 30 responds to the clock pulse generator 20 to cause one of the coils 6 and one of the teeth 5 to record time markings.

FIG. 4 shows a speed diagram of the type produced by the system shown in FIGS. 1 and 2. The scale on the right indicates the values represented within each range. The diagram is read from left to right starting with tracings in the range between 40 and 50 km/h and 2.5 to 5 km/h. Thus, at the extreme left, the actual driven speed value may be about 44 km/h. As may also be seen from FIG. 4, the vehicle was then accelerated until a speed was recorded in the range between 60 and 70 km/h and between 2.5 and 5 km/h. This represents a speed of approximately 72.5 to 75 km/h. The speed was then reduced and the brakes applied as shown by the line 31. This resulted in a rapid decrease in the speed.

The invention retains the merits of recording line diagrams but supplements it by incremental values with little expense. It results in an increase in the exactness of a recordings of a measured quantity.

In reading the recordings of FIG. 4, the speed at any time is determined by adding the decade value from 10 to 100 km/h to the particular sub decade range occurring at that time.

What is claimed is:

1. A recording device comprising:
   moving means for transporting a record carrier in a given direction;
   a plurality of recording means arranged in a row transverse to the transport direction of the record carrier for recording continuously changing values in the form of line diagrams along a plurality of tracks on said recording means;
   said plurality of recording means including a first group of recording means, each of said recording means in said first group being arranged to trace a line along a track when the value falls in a predetermined range different from the ranges to which the other recording means of the first group responds;
   said plurality of recording means including a second group of recording means, each of said second group of recording means being arranged to record in response to the value occurring in a predetermined increment within said ranges so that a recording means of said second group serves to produce a line whenever the value reaches a particular increment regardless of the range within which the increment occurs; and
   measuring means;
   said measuring means including a first pulse counter and a second pulse counter, a first store and a second store, a first decoding circuit and a second decoding circuit;
   said first pulse counter being connected to said first store and said first store being connected to said first decoding circuit and said first decoding circuit being connected to said first group of recording means, said second pulse counter being connected to said second group of recording means through said second store and said second decoding circuit, said pulse counters being responsive to the value being measured.

2. A recording device as in claim 1, wherein said measuring means includes a timing circuit responsive to said first pulse counter and connected to the recording means responding to the highest range of the measured values for actuating said highest value recording means in the first group independently of the other recording means in the first group.

3. A recording device for measuring variable values and recording them on a record carrier, comprising:

moving means for moving the record along a given direction, a plurality of recording means for defining separate tracks along the direction when the record carrier moves and for tracing lines along the tracks when actuated;

said plurality of recording means forming a first group and a second group, measuring means coupled to said recording means for measuring the variable value;

energizing means for energizing a different recording means of the first group for each one of a number of a ranges of measured values and for energizing a different recording means of the second group for each one of a number of increments of measured values within each range, each recording means of the second group being energized for the corresponding increment t within each range.

4. A device as in claim 3, wherein said measuring means includes a first pulse counter and a second pulse counter, a first store and a second store, a first decoding circuit and a second decoding circuit;

said first pulse counter being connected to said first store and said first store being connected to said first decoding circuit and said first decoding circuit being connected to said first group of recording means, said second pulse counter being connected to said second group of recording means through said second store and said second decoding circuit, said pulse counters being responsive to the value being measured.

5. A device as in claim 4, wherein said measuring means includes a timing circuit responsive to said first pulse counter and connected to the recording means responding to the highest range of the measured values for actuating said highest value recording means in the first group independently of the other recording means in the first group.

6. A recording device according to claims 1, 2, 3, 4, or 5, wherein said plurality of recording means form parts of a comb-shaped recording device.

* * * * *